(12) United States Patent
Gardner et al.

(10) Patent No.: US 6,303,962 B1
(45) Date of Patent: *Oct. 16, 2001

(54) DIELECTRICALLY-ISOLATED TRANSISTOR WITH LOW-RESISTANCE METAL SOURCE AND DRAIN FORMED USING SACRIFICIAL SOURCE AND DRAIN STRUCTURES

(75) Inventors: Mark I. Gardner, Cedar Creek; H. Jim Fulford, Jr., Austin, both of TX (US); Charles E. May, Gresham, OR (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/227,512

(22) Filed: Jan. 6, 1999

(51) Int. Cl.[7] ............................. A01L 27/01; A01L 27/12; A01L 31/0392
(52) U.S. Cl. .................... 257/347; 257/348; 257/349; 257/350; 257/351
(58) Field of Search .................................. 257/347, 350, 257/351, 348, 349

(56) References Cited

U.S. PATENT DOCUMENTS

| | | | |
|---|---|---|---|
| 4,040,073 | * | 8/1977 | Luo .......................................... 357/4 |
| 4,893,158 | * | 1/1990 | Mihara et al. ..................... 357/23.13 |
| 5,168,072 | | 12/1992 | Moslehi . |
| 5,504,031 | | 4/1996 | Hsu et al. . |
| 5,637,525 | * | 6/1997 | Dennison ............................. 257/351 |
| 5,773,358 | | 6/1998 | Wu et al. . |
| 5,945,698 | * | 8/1998 | Prall ...................................... 257/350 |
| 5,955,770 | * | 9/1999 | Chan et al. .......................... 257/408 |
| 5,981,345 | * | 11/1999 | Ryum et al. ......................... 438/303 |
| 6,093,628 | * | 7/2000 | Lim et al. ............................. 438/592 |

FOREIGN PATENT DOCUMENTS

405075119 * 3/1993 (JP) ..................................... 257/347

* cited by examiner

Primary Examiner—Jerome Jackson, Jr.
Assistant Examiner—Jesse A. Fenty
(74) Attorney, Agent, or Firm—Kevin L. Daffer; Conley, Rose & Tayon P.C.

(57) ABSTRACT

A transistor is provided and formed using self-aligned low-resistance source and drain regions within a metal-oxide semiconductor (MOS) process. The gate of the transistor may also be formed from a low-resistance material such as a metal. The transistor channel is located in a polysilicon layer arranged over a dielectric layer on a semiconductor substrate. To fabricate the transistor, an isolating dielectric, polysilicon layer, and protective dielectric layer are deposited over a semiconductor substrate. Source/drain trenches are formed in the protective dielectric and polysilicon layers and subsequently filled with sacrificial dielectrics. The protective dielectric lying between these sacrificial dielectrics is removed, and replaced with sidewall spacers, a gate dielectric, and a gate conductor which may be formed from a low-resistance metal. The sacrificial dielectrics are subsequently removed and replaced with source/drain regions which may be formed from a low-resistance metal. The resulting transistor may exhibit low contact and series resistances, and increased operation speed.

18 Claims, 6 Drawing Sheets

DIELECTRICALLY-ISOLATED TRANSISTOR WITH LOW-RESISTANCE METAL SOURCE AND DRAIN FORMED USING SACRIFICIAL SOURCE AND DRAIN STRUCTURES

BACKGROUND OF THE INVENTION

1. Field of the Invention

This invention relates to integrated circuit fabrication, and more particularly, to a semiconductor device having self-aligned low-resistance source, drain and gate structures and to a method for producing this device.

2. Description of the Relevant Art

Advances in computer technology, among other factors, result in a continual demand for faster integrated circuits. Integrated circuit speed may be limited by various factors, such as circuit architecture, interconnection delays, and speed limitations of individual transistors. Such transistor speed limitations may often be described in terms of RC time constants, where R and C are resistance and capacitance, respectively, associated with the transistor structure. RC time constants characterize the time needed for a transistor to turn on or off, so that transistor speed may be increased by making RC time constants as low as possible. One type of resistance associated with a transistor structure is series resistance, or resistance encountered by carriers traveling within a given portion of the transistor, such as the source of a MOSFET. Contact resistance, the resistance associated with a contact to a transistor region, is another type.

Both series and contact resistance are associated with source, drain, and gate regions of MOS transistors. Series resistance is related to the resistivity of the doped silicon typically used for source, drain and gate regions, while contact resistance is related to the resistance of the junction formed between such a silicon source, drain or gate region and an interconnect, which is typically formed from metal. A partial cross-sectional view of a conventional MOSFET structure is shown in FIG. 1. Gate dielectric 12 and polysilicon gate conductor 14 are formed upon silicon substrate 10 by deposition and patterning of dielectric and polysilicon layers. Source and drain regions 16 are of opposite carrier type than substrate 10. No patterning step is needed for introduction of source and drain 16, since these impurity distributions are typically introduced after formation of gate conductor 14. Gate conductor 14 serves as a mask to exclude the dopants forming source and drain 16 from the transistor channel underlying gate dielectric 12. Because photolithography and the associated alignment process is not used in forming source and drain 16, the source and drain are said to be "self-aligned" to the gate. The transistor and the fabrication method used to form it are also often described as self-aligned.

Self-aligned source/drain regions such as regions 16 in FIG. 1 exhibit minimal overlap with the transistor gate, minimizing the parasitic capacitances that can increase RC time constants and limit high-frequency transistor performance. In addition, the self-alignment process allows smaller feature sizes to be used, because the size tolerances which must be left to allow for lithographic alignment error are not needed. The use of conventional self-aligned processes does impose limitations upon transistor fabrication, however. For example, the use of impurity regions in the semiconductor substrate to form the source and drain necessitates high-temperature (greater than about 900° C.) processing to activate impurities and anneal substrate damage, if the source and drain impurities are introduced by ion implantation (as is generally the case). Alternative impurity introduction methods such as diffusion also involve high-temperature processes. The choice of gate materials is therefore limited, because the gate must be able to withstand the high-temperature source/drain processing. In part for this reason, the current material of choice for gate conductors in MOSFET fabrication is polycrystalline silicon, or polysilicon. The resistivity of a polysilicon gate conductor is typically lowered by doping, which is often performed by ion implantation, using the same implants which dope the self-aligned source and drain.

Problems can arise with this doping, however, in part because of the different rates of dopant diffusion in polysilicon as opposed to single-crystal silicon. Although typical gate conductor thicknesses are greater than the depths of the shallow junctions required for source and drain regions in high-performance devices, diffusion rates along the grain boundaries of polycrystalline films can be on the order of one hundred times as fast as in single-crystal silicon. This can allow dopants in a polysilicon gate conductor to diffuse across the thin gate dielectric and into the underlying channel region during high-temperature processes such as implant anneals. Such diffusion can leave a region of low carrier concentration in the polysilicon directly above the gate dielectric, an occurrence often called the "polysilicon depletion effect". This region of the gate conductor adjacent to the gate dielectric therefore has a higher resistivity, and the resulting device performs as if it had an increased gate dielectric thickness. Effective doping of polysilicon gate regions is further complicated in CMOS devices because of differences in diffusion behavior of boron, the typical p-channel transistor dopant, and arsenic, the typical n-channel transistor dopant. Boron diffuses more rapidly in polysilicon than arsenic, which tends to segregate at grain boundaries. Adequate activation of arsenic impurities throughout the gate conductor of an n-channel device without causing excessive boron diffusion and polysilicon depletion effects in a p-channel device presents significant challenges.

A gate conductor made from a low-resistance metal would alleviate many of the problems with polysilicon gate conductors discussed above. Unfortunately, low-resistance metals such as aluminum are not able to withstand the high-temperature processing needed, for example, to anneal the as-implanted source and drain regions employed within a standard self-aligned process. It would therefore be desirable to develop a method of forming self-aligned gates using low-resistance metals or metal alloys. The desired method should further provide low-resistance source and drain regions, and low-resistance contacts to source, drain and gate regions so that series and contact resistances associated with the resulting transistor are reduced.

SUMMARY OF THE INVENTION

The problems outlined above are in large part addressed by a transistor having a source and drain formed from metal, and a method for fabricating this transistor. The transistor gate may also be formed from metal, or from other materials such as polysilicon. The transistor channel is formed in a polysilicon layer arranged over a dielectric layer on a semiconductor substrate. Use of the polysilicon layer allows the metal source and drain to extend vertically across and below the transistor channel. The dielectric layer serves as an etch stop to allow the metal source and drain regions to extend to the bottom of the channel polysilicon layer, and also provides transistor well isolation. To fabricate the transistor, an isolating dielectric layer is formed upon a semiconductor substrate, and a polysilicon layer is deposited over the isolating dielectric layer. A protective dielectric layer is subsequently deposited over the polysilicon layer. Trenches are formed in the polysilicon and protective dielectric layers by patterning and etching. These trenches, in which the final source and drain are subsequently formed, are filled with a sacrificial dielectric material. This sacrificial material is formed from a different dielectric than that used for the isolating and protective dielectric layers, in order to allow etch selectivity between the sacrificial dielectric and the protective and isolating dielectrics.

After formation of the sacrificial dielectrics, the protective dielectric layer is removed to allow doping of the polysilicon layer. This doping may include well, punchthrough, and/or threshold adjust implants. Dielectric spacers are subsequently formed on portions of the sacrificial dielectric sidewalls which extend above the upper surface of the polysilicon layer. The spacers are formed from a different dielectric than that used for the sacrificial dielectrics. A gate dielectric is formed upon the polysilicon layer, and the region above the gate dielectric and between the exposed lateral surfaces of the dielectric spacers is filled with a conductive material to form a gate conductor. Because no further high-temperature processing is believed to be needed, the gate conductor may be formed from a low-resistance metal such as copper or aluminum. Alternatively, a different material such as polysilicon may be used. If the gate conductor is formed from polysilicon, the polysilicon is doped either during deposition or by a subsequent impurity introduction. If an impurity introduction is performed using ion implantation, a subsequent anneal is carried out.

Subsequent to gate conductor formation, the sacrificial dielectrics are removed to form trenches bounded by upper surfaces of the isolating dielectric and substantially vertical sidewalls of the dielectric spacers and the polysilicon layer. These trenches are filled with metal to form permanent, low-resistance metal source/drain regions. Isolation regions may be formed to separate the transistor from adjacent devices. Openings may be formed by patterning and etching on either side of the transistor, extending from the upper surface of the gate conductor down to the upper surface of the isolating dielectric. The openings are filled with a dielectric material to form isolation regions.

The sidewall spacers formed adjacent to the sacrificial dielectrics may serve to define the dimensions of the permanent source/drain structures formed after the sacrificial dielectrics are removed. In this manner, the permanent source/drain structures may be self-aligned to the gate conductors. The only masking steps believed to be needed for the process recited herein are the mask which defines the openings for the sacrificial dielectrics and the mask which defines openings for device isolation regions. This small number of masking steps allows extremely small devices to be fabricated, because fewer alignment tolerances need to be included in feature dimensions. Because the permanent source/drain regions are formed after any high-temperature processing needed for channel doping, gate dielectric formation, and/or gate conductor doping, they may be formed from a low-temperature material such as aluminum or copper. Copper source/drain regions may be particularly advantageous because of the low resistance of copper, and because such source/drain regions may be easily integrable with low-resistance copper interconnect technologies.

The low-resistance source/drain regions recited herein are formed using deposition and planarization steps, and may be formed using temperatures of less than about 500° C. High-temperature processing is therefore believed to be not necessary following formation of the transistor gate conductor. The gate conductor may therefore also be formed from a low-resistance metal such as aluminum or copper. Source, drain and gate regions formed from such a low-resistance metal are believed to exhibit substantially lower series and contact resistances than conventional silicon or polysilicon source, drain and gate regions. This improvement is believed to result from a metal resistivity which may be as much as $10^6$ times smaller than that of doped silicon or polysilicon. The lowered series and contact resistances believed to be exhibited by the transistor formed by the method recited herein may result in reduced RC time constants and faster device and circuit operation.

In addition to the method described above, a self-aligned semiconductor device having metal source/drain regions is contemplated herein. An isolating dielectric layer is arranged upon a semiconductor substrate. A pair of source/drain regions, preferably formed from a low-resistance metal, are arranged upon the upper surface of the isolating dielectric. A polysilicon layer containing the transistor channel is disposed upon the isolating dielectric, laterally adjacent and between the source/drain regions. Dielectric spacers are formed above and partially covering the polysilicon layer and laterally adjacent sidewalls of the source/drain regions. A gate conductor is dielectrically spaced above the polysilicon layer and laterally adjacent and between the sidewall spacers, such that the upper surface of the gate conductor is level with the upper surfaces of the source/drain regions. The gate conductor may be formed from a metal, or from a different material such as polysilicon. A pair of dielectric isolation regions may be arranged on either side of the pair of source/drain regions, respectively.

BRIEF DESCRIPTION OF THE DRAWINGS

Other objects and advantages of the invention will become apparent upon reading the following detailed description and upon reference to the accompanying drawings in which.

Figure 1:
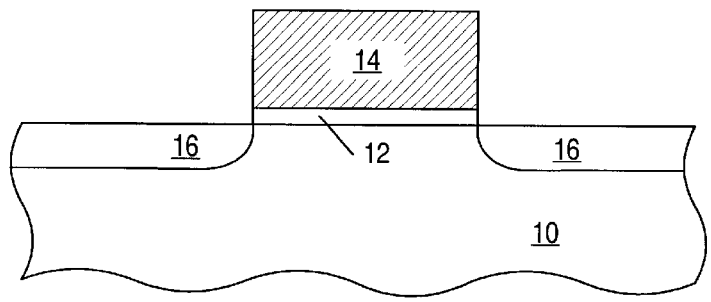
FIG. 1 is a partial cross-sectional view of a semiconductor topography including a self-aligned transistor formed using a conventional process.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed. On the contrary, the intention is to cover all modifications, equivalents, and alternatives falling within the spirit and scope of the present invention.

DETAILED DESCRIPTION OF THE PREFERRED EMBODIMENTS

Figure 2:
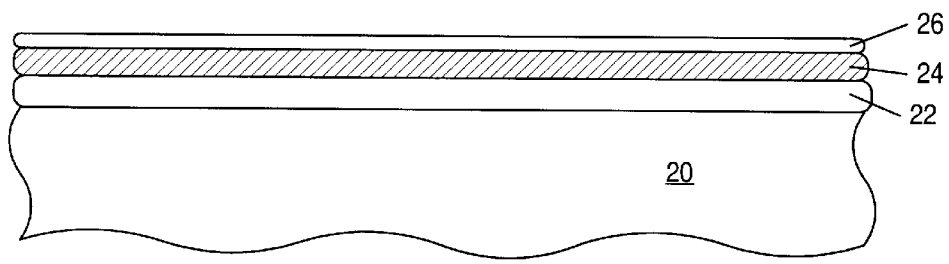
FIG. 2 is a partial cross-sectional view of a semiconductor topography including an isolation dielectric layer, a polysilicon layer, and a protective dielectric layer formed over a semiconductor substrate.

Turning to the drawings, FIG. 2 illustrates a partial cross-section of a semiconductor topography including isolating dielectric 22, polysilicon layer 24, and protective dielectric 26 formed on semiconductor substrate 20, according to an embodiment of the method recited herein. Semiconductor substrate 20 is preferably monocrystalline silicon. The doping level and carrier type of substrate 20 are not critical, because the transistor channel is subsequently formed in polysilicon layer 24 rather than in semiconductor substrate 20. Isolating dielectric 22 is preferably deposited by chemical vapor deposition (CVD). Suitable dielectrics for isolating dielectric 22 include silicon dioxide ("oxide"), silicon nitride ("nitride"), and silicon oxynitride ("oxynitride"). For the purposes of this application, "oxynitride" refers to dielectrics formed from silicon, oxygen, and nitrogen, and includes, for example, nitrided oxides. Ways in which such a dielectric may be formed include deposition using precursors containing silicon, oxygen and nitrogen, or annealing of an oxide in a nitrogen-bearing ambient. Suitable deposition methods may include low-pressure CVD (LPCVD), plasma-enhanced CVD (PECVD), and atmospheric-pressure CVD (APCVD). In embodiments for which isolating dielectric 22 is formed from nitride, a thin pad oxide may be grown or deposited between isolating dielectric 22 and substrate 20. Alternatively, isolating dielectric 22 may be grown by heating substrate 20 to a temperature greater than about 700° C. in an oxidizing (for, e.g., oxide or oxynitride) and/or nitrogen-bearing (for, e.g., nitride or oxynitride) ambient. Isolating dielectric 22 typically has a thickness between about 1000 angstroms and about 3000 angstroms.

Polysilicon layer 24 is preferably deposited by pyrolysis, or thermal decomposition, of silane in an LPCVD reactor at a temperature between about 550° C. and about 650° C. Other types of CVD which may also be suitable for formation of polysilicon layer 24 include PECVD and APCVD. If a deposition temperature of less than 580° C. is used, an amorphous silicon layer may be formed. A polycrystalline layer may be formed from such an amorphous layer by heating it to temperatures above about 400° C. Because polysilicon layer 24 is heated, for example, to anneal subsequent channel impurity implants, a polycrystalline layer will result even if layer 24 is originally deposited in amorphous form. Moreover, a subsequent anneal may be performed specifically for the purpose of increasing the grain size in polysilicon layer 24, so that a subsequently-formed transistor channel may be formed in a substantially single-crystalline region. Such an anneal may be performed using temperatures between about 400° C. and about 1000° C. Polysilicon layer 24 typically has a thickness between about 1000 angstroms and 1500 angstroms.

Protective dielectric 26 is preferably deposited by CVD upon polysilicon layer 24. As in the case of isolating dielectric 22, protective dielectric 26 may be formed from various dielectrics including oxide, nitride, and oxynitride, and by methods including PECVD, LPCVD, and APCVD. Alternatively, protective dielectric 26 may be grown from polysilicon layer 24 by heating layer 24 to a temperature greater than about 700° C. in an oxidizing and/or nitrogen-bearing ambient. Protective dielectric 26 typically has a thickness between about 200 angstroms and about 500 angstroms. In embodiments for which protective dielectric 26 is thermally grown, a greater thickness of polysilicon layer 24 may be desirable, to compensate for the polysilicon consumed by such a thermal growth process. As in the case of isolating dielectric 22, a thin oxide may be deposited or grown below protective dielectric 26 in embodiments for which dielectric 26 is formed from nitride.

Figure 3:
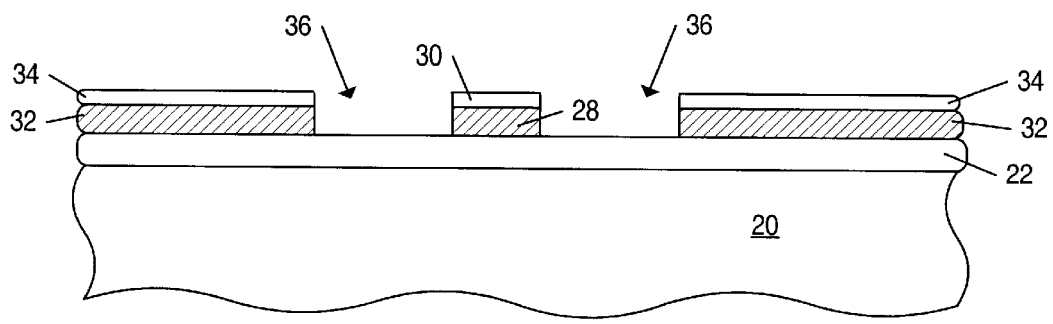
FIG. 3 is a partial cross-sectional view of the semiconductor topography, wherein source/drain trenches are formed through the protective dielectric and polysilicon layers, subsequent to the layer formation of FIG. 2.

Source/drain trenches 36 are subsequently formed in polysilicon layer 24 and protective dielectric 26, as shown in FIG. 3. Trenches 36 may be formed by depositing a layer of photoresist upon protective dielectric 26, and exposing the photoresist through a mask. The photoresist is subsequently developed, so that openings are formed exposing portions of the upper surface of protective dielectric 26. An anisotropic etching technique may then be used to etch away the exposed portions of dielectric 26 and underlying portions of polysilicon layer 24, and the photoresist may be subsequently removed. Source/drain trenches 36 divide protective dielectric 26 and polysilicon layer 24, shown in FIG. 2, into channel polysilicon portion 28, channel protective dielectric 30, external polysilicon portions 32, and external protective dielectrics 34, as shown in FIG. 3.

Figure 4:
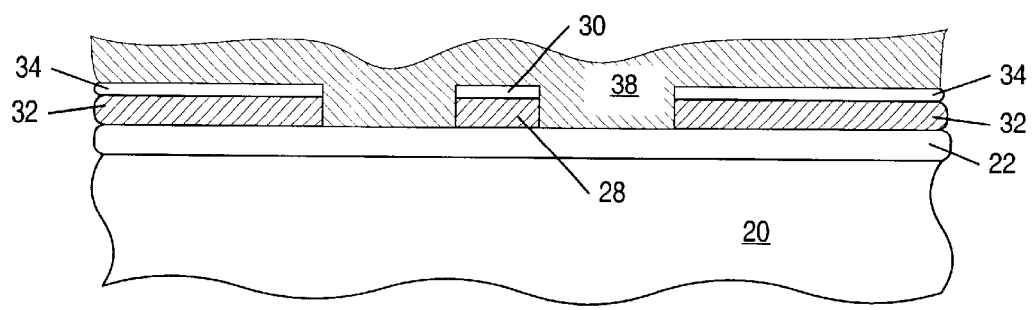
FIG. 4 is a partial cross-sectional view of the semiconductor topography, wherein a conformal dielectric layer is deposited to fill the source/drain trenches, subsequent to the trench formation of FIG. 3.

Conformal dielectric layer 38 is subsequently deposited over semiconductor substrate 20 such that source/drain trenches 36 are filled, as shown in FIG. 4. Dielectric layer 38 is formed from a different dielectric than that used to form isolating dielectric 22 and protective dielectric 26, so that the sacrificial dielectrics subsequently formed from dielectric layer 38 may exhibit etch selectivity with respect to isolating dielectric 22 and protective dielectric 26. For example, if dielectrics 22 and 26 are formed from oxide, dielectric layer 38 may be nitride or oxynitride. Dielectric layer 38 is preferably deposited using a CVD technique. For example, if dielectric layer 38 is formed from oxide (dielectrics 22 and 26 would be formed from a different dielectric, such as nitride or oxynitride, in this case), decomposition of tetraethyl orthosilicate (TEOS) may be performed in an LPCVD reactor at a substrate temperature in the range from about 400° C. to about 800° C. to produce a very conformal film. Alternatively, other techniques such as CVD using a silane source may be used.

Figure 5:
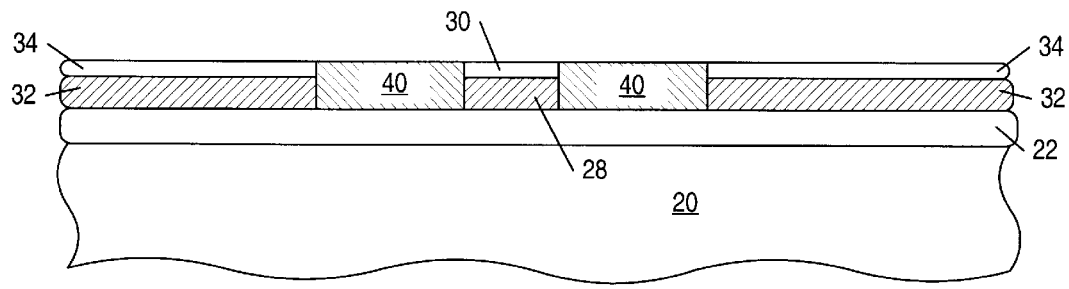
FIG. 5 is a partial cross-sectional view of the semiconductor topography, wherein portions of the dielectric layer external to the trenches are removed to form sacrificial dielectrics, subsequent to the dielectric deposition of FIG. 4.
Figure 6:
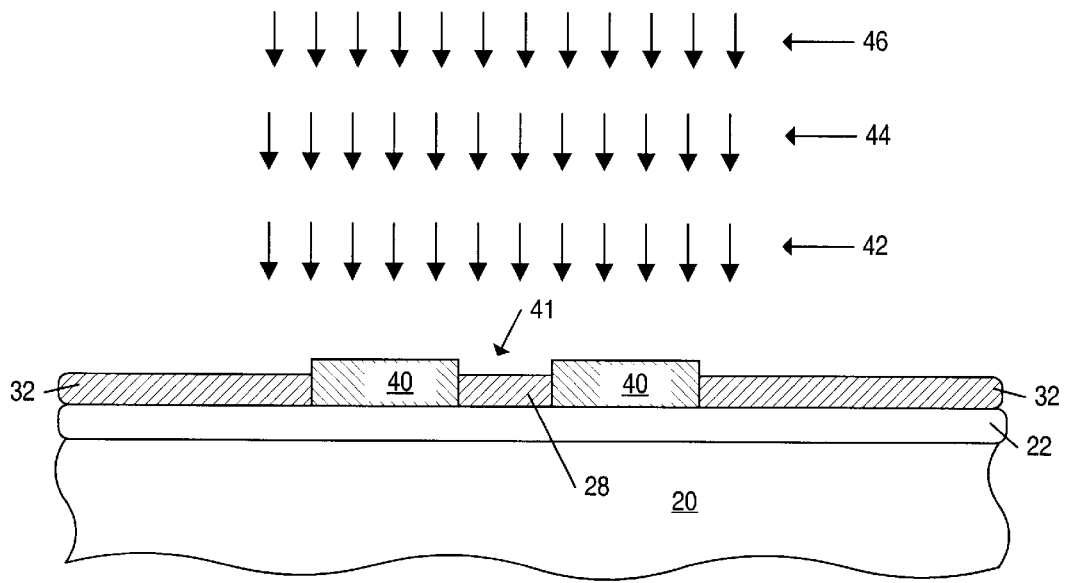
FIG. 6 is a partial cross-sectional view of the semiconductor topography, wherein the protective dielectric layer is removed and impurities are introduced into the polysilicon layer, subsequent to the dielectric portion removal of FIG. 5.

Portions of dielectric layer 38 which extend above the upper surfaces of protective dielectrics 30 and 34 are subsequently removed, as shown in FIG. 5. The removal process is preferably performed using chemical-mechanical polishing (CMP), although other techniques, such as reflow and etchback, may also be suitable. The remaining portions of dielectric layer 38 form sacrificial dielectrics 40, which have upper surfaces at the same level as the upper surfaces of protective dielectrics 30 and 34. Protective dielectrics 30 and 34 are subsequently removed, as shown in FIG. 6. This removal is preferably done using a dry etching process, but other etches may also be suitable. For example, in an embodiment for which protective dielectrics 30 and 34 are oxide and sacrificial dielectrics 40 are nitride or oxynitride, protective dielectrics 30 and 34 may be removed by a wet etch in hydrofluoric acid buffered with ammonium fluoride, which is selective to oxide over nitride so that sacrificial dielectrics 40 are not removed. Removal of protective dielectric 30 forms gate trench 41, which is bounded by the upper surface of channel polysilicon portion 28 and sidewalls of sacrificial dielectrics 40.

Channel impurities are subsequently introduced into polysilicon portions 28 and 32 using impurity introduction processes such as processes 42, 44 and 46 of FIG. 6, which are preferably ion implantation processes. By analogy with conventional transistor fabrication processes, impurity introduction 42 may represent a well implant, introduction 44 may represent a punchthrough preventing implant, and introduction 46 may represent a threshold adjust implant. Because the thickness of channel polysilicon portion 28 is typically less than about 1500 angstroms, a single impurity introduction may be sufficient to provide both well doping and punchthrough protection, rather than the two introductions 42 and 44 of FIG. 6. For an n-channel transistor, well and punchthrough impurities are p-type, while for a p-channel transistor these impurities are n-type. Threshold adjust impurities, which may be introduced using impurity introduction 46, are typically p-type in n-channel transistors. Such threshold adjust impurities may be implanted into the upper portion of channel polysilicon portion 28 by appropriate choice of implantation energy for introduction 46. Punchthrough prevention impurities may be placed somewhat deeper within channel polysilicon portion 28 by using a higher implantation energy in impurity introduction 44. If well impurities are introduced by a process such as impurity introduction 42, the impurities may be introduced such that they are relatively evenly distributed throughout channel polysilicon portion 28. In embodiments for which channel dopants are introduced by ion implantation, a subsequent anneal is performed to activate the implanted impurities and repair any damage to channel polysilicon portion 28.

Figure 7:
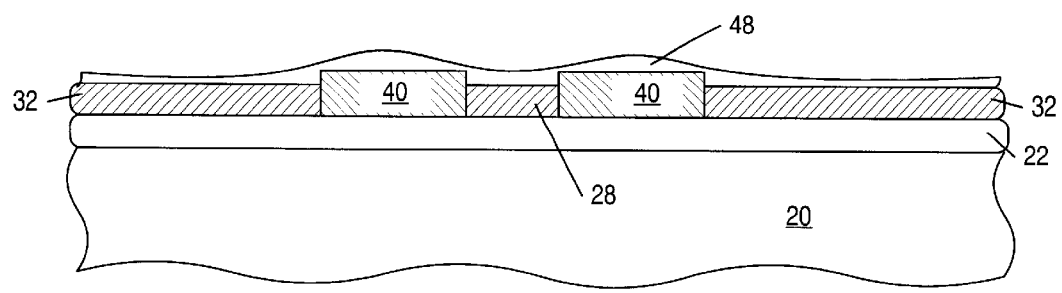
FIG. 7 is a partial cross-sectional view of the semiconductor topography, wherein a conformal dielectric layer is deposited over the polysilicon layer and sacrificial dielectrics, subsequent to the impurity introduction of FIG. 6.
Figure 8:
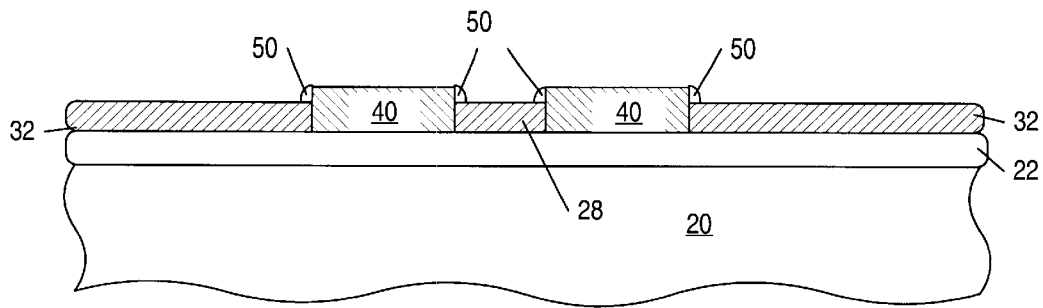
FIG. 8 is a partial cross-sectional view of the semiconductor topography, wherein portions of the dielectric layer are removed to form spacers, subsequent to the dielectric deposition of FIG. 7.

Conformal dielectric layer 48 is subsequently deposited over polysilicon portions 28 and 32 and sacrificial dielectrics 40, as shown in FIG. 7. Dielectric layer 48 is formed from a different dielectric than that used to form sacrificial dielectrics 40, so that sacrificial dielectrics 40 may be subsequently removed without damage to the spacers which are formed from dielectric layer 48. Suitable dielectrics for dielectric layer 48 may include oxide, nitride and oxynitride. Other dielectrics which may be suitable include low-permittivity ("low-K") dielectrics such as fluorine-doped oxide. Dielectrics having a dielectric constant lower than about 3.5 are typically considered to be low-K dielectrics, while the dielectric constant of undoped oxide is about 4. In embodiments for which dielectric layer 48 is formed from nitride, a thin pad oxide may be deposited or grown prior to deposition of dielectric layer 48. Portions of dielectric layer 48 are subsequently removed, preferably using an anisotropic etch process, to form spacers 50 on sidewalls of sacrificial dielectrics 40, as shown in FIG. 8. Spacers 50 provide electrical isolation between the transistor gate subsequently formed above polysilicon portion 28 and the transistor source/drain regions subsequently formed in place of sacrificial dielectrics 40. Use of a low-K dielectric to form spacers 50 may be advantageous in reducing capacitance between these gate and source/drain regions. The lateral width of spacers 50 may be as small as about 150 angstroms. In a preferred embodiment, spacers 50 have a lateral width between about 150 angstroms and about 300 angstroms. Wider spacers may be used, but spacers narrower than about 150 angstroms may result in excessive capacitance between the gate and source/drain regions of the subsequently-completed transistor.

Figure 9:
FIG. 9 is a partial cross-sectional view of the semiconductor topography, wherein a gate dielectric is formed upon the polysilicon layer, subsequent to the spacer formation of FIG. 8.
Figure 9:
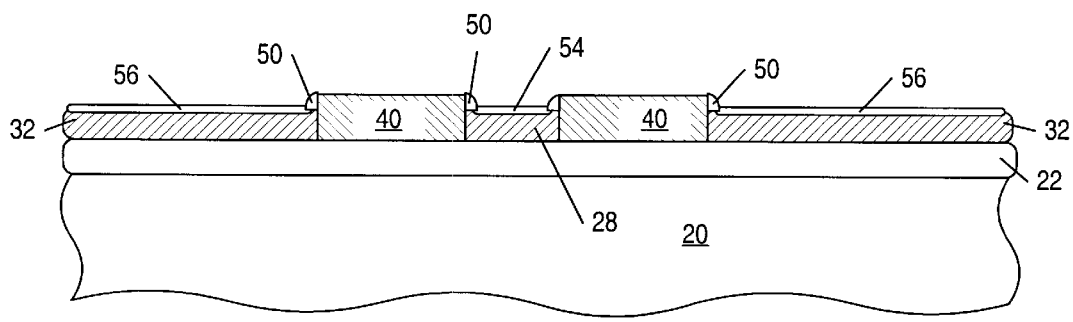
Figure 10:
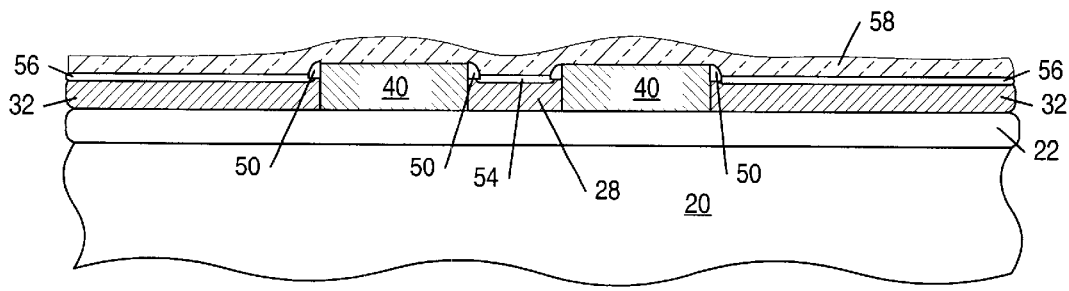
FIG. 10 is a partial cross-sectional view of the semiconductor topography, wherein a conductive material is deposited over the gate dielectric, spacers and sacrificial dielectrics, subsequent to the gate dielectric formation of FIG. 9.

Gate dielectric 54 is subsequently formed on the exposed upper surface of channel polysilicon portion 28, as shown in FIG. 9. External dielectrics 56 are simultaneously formed on exposed upper surfaces of external polysilicon portions 32. Dielectrics 54 and 56 may be grown using thermal process 52, in which substrate 20 is heated to a temperature of at least 700° C. in an oxidizing and/or nitrogen-bearing ambient. Alternatively, dielectrics 54 and 56 may be deposited using a CVD technique. Dielectrics which may be used for dielectrics 54 and 56 include oxide, nitride, oxynitride and/or combinations of these. Turning now to FIG. 10, conductive layer 58 is deposited over dielectrics 54 and 56, spacers 50, and sacrificial dielectrics 40, such that gate trench 41, shown in FIG. 6, is filled. Conductive layer 58 is preferably formed using a low-resistivity metal such as copper or aluminum, or a metal alloy which demonstrates high conductivity. Copper may be particularly advantageous because of its extremely low resistivity, and its compatibility with copper interconnect processes. Because subsequent source and drain region formation employs low-temperature deposition and planarization techniques, conductive layer 58 is believed not to undergo high temperatures during subsequent processing. It is therefore believed to be not necessary for conductive layer 58 to be capable of withstanding high temperatures. The substrate temperature used for deposition of conductive layer 58 is typically between about 200° C. and 300° C.

In an embodiment for which conductive layer 58 is formed from copper, gate dielectric 54 is preferably silicon nitride, because silicon nitride is believed to be more effective than silicon dioxide in blocking diffusion of copper atoms from their deposited positions. Deposition of copper or other metals for conductive layer 58 may include deposition of an adhesion promoting layer and/or deposition of a diffusion barrier layer. Titanium nitride, for example, may be a suitable material for both adhesion promotion and diffusion blocking. Titanium nitride may be deposited by methods including evaporation or sputtering of titanium in a nitrogen ambient, sputtering of titanium nitride, and thermal nitridation of sputtered titanium. Copper deposition may also include formation of a thin seed layer of copper by physical vapor deposition (PVD) techniques such as evaporation or sputtering, or by CVD. Deposition of thicker copper layers may include CVD, PVD and plating techniques.

Figure 11:
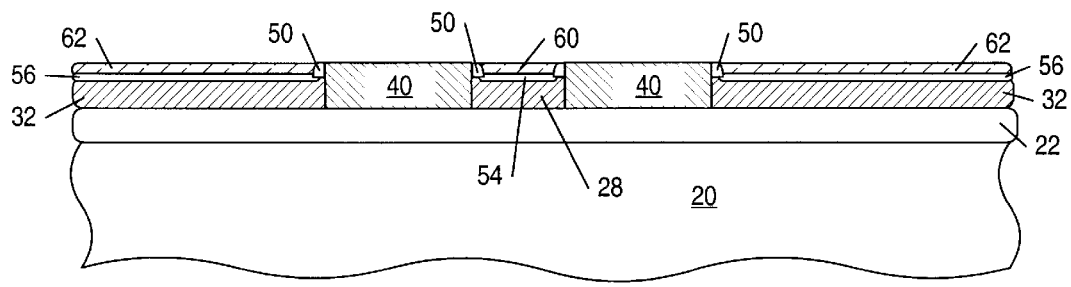
FIG. 11 is a partial cross-sectional view of the semiconductor topography, wherein portions of the conductive material extending above the upper surface of the sacrificial dielectrics are removed such that a gate conductor is formed, subsequent to the conductive material deposition of FIG. 10.

Portions of conductive layer 58 which extend above the upper surfaces of sacrificial dielectrics 40 are subsequently removed, as shown in FIG. 11. The removal is preferably done using CMP, and the remaining portions of conductive layer 58 form gate conductor 60 and external conductors 62. The CMP process of FIG. 11 may be continued until the upper surfaces of gate conductor 60 and sacrificial dielectrics 40 are at a slightly lower elevation than the elevation of the upper surfaces of sacrificial dielectrics 40 before the CMP process of FIG. 11. In other words, the surface which includes upper surfaces of dielectrics 40, spacers 50 and gate conductor 60 may be slightly "overpolished". In this way, the widths of the upper surfaces of spacers 50 are slightly increased, insuring adequate isolation between gate conductor 60 and the source/drain regions subsequently formed in place of sacrificial dielectrics 40. A similar overpolishing technique may be employed in the subsequent CMP process of FIG. 14 below.

Figure 12:
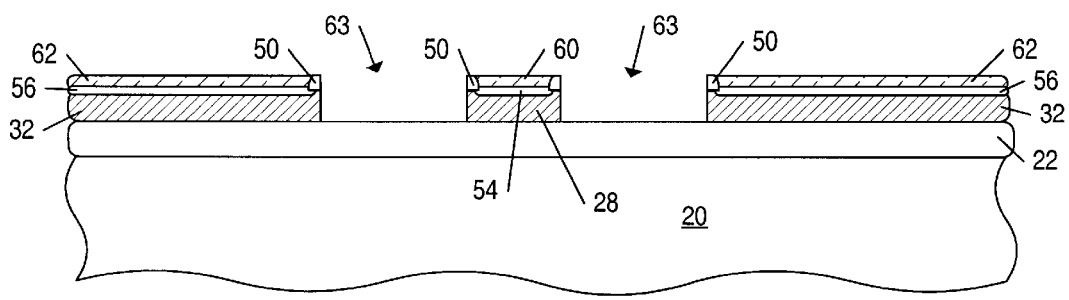
FIG. 12 is a partial cross-sectional view of the semiconductor topography, wherein the sacrificial dielectrics are removed from the source/drain trenches, subsequent to the gate conductor formation of FIG. 11.
Figure 13:
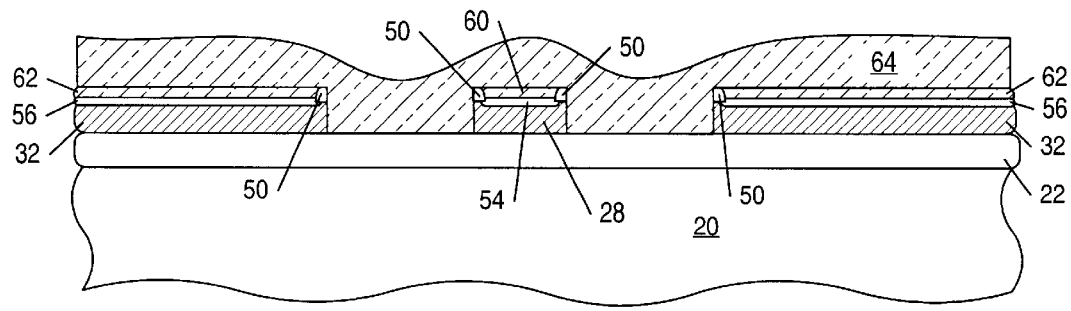
FIG. 13 is a partial cross-sectional view of the semiconductor topography, wherein a conductive layer is deposited to fill the source/drain trenches, subsequent to the sacrificial dielectric removal of FIG. 12.

Sacrificial dielectrics 40 are subsequently removed, as shown in FIG. 12. As in the case of the protective dielectric removal of FIG. 6, this removal is preferably done using a dry etching process, but other etches may also be suitable. Removal of dielectrics 40 forms source/drain trenches 63, which are similar to source/drain trenches 36 of FIG. 3. Source/drain trenches 63 are bounded by the upper surface of isolating dielectric 22, and by sidewalls of polysilicon portions 28 and 32 and sidewalls of spacers 50. Conductive a layer 64 is subsequently deposited such that trenches 63 are filled, as shown in FIG. 13. As in the case of conductive layer 58 of FIG. 10, conductive material 64 is preferably a low-resistivity metal such as copper or aluminum, or a metal alloy which demonstrates high conductivity. The composition and deposition methods suitable for conductive material 64 are similar to those for conductive material 58. Conductive layers 64 and 58 may both include multiple metals, diffusion barriers, and/or adhesion promoting layers. In one embodiment, formation of conductive layer 64 may begin with deposition of thin layers of titanium and cobalt, followed by a layer of either titanium nitride or nickel. Copper may then be deposited to complete layer 64. A subsequent contact forming or alloying anneal may be used, but is not believed to be necessary. Even with such an anneal, the formation of conductive layer 64 is believed to involve no heating above about 500° C.

Figure 14:
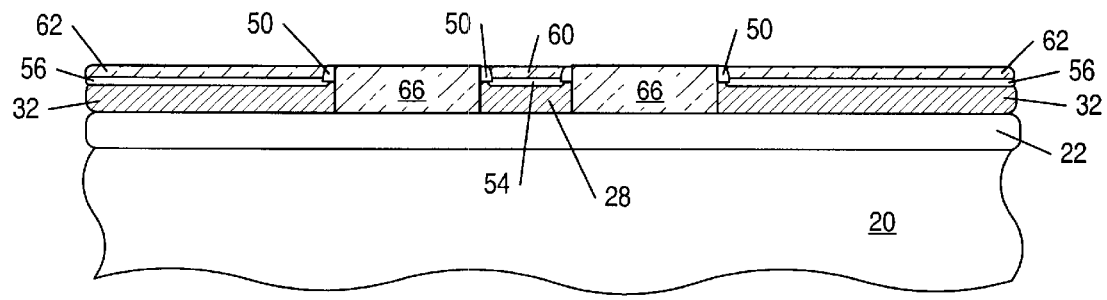
FIG. 14 is a partial cross-sectional view of the semiconductor topography, wherein portions of the conductive layer external to the source/drain trenches are removed so that source/drain regions are formed, subsequent to the conductive layer deposition of FIG. 13.
Figure 15:
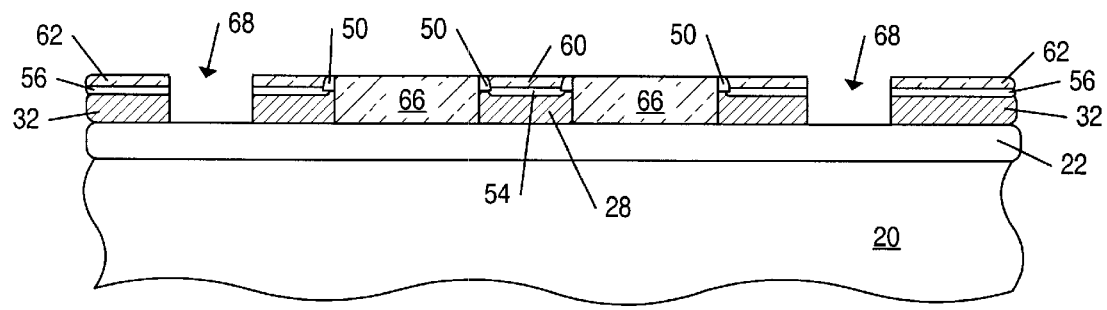
FIG. 15 is a partial cross-sectional view of the semiconductor topography, wherein isolation trenches are formed on either side of the pair of source/drain regions, subsequent to the source/drain region formation of FIG. 14.

Portions of conductive layer 64 external to source/drain trenches 63 are subsequently removed, as shown in FIG. 14. The removal is preferably done using CMP, and the remaining portions of conductive layer 64 form source/drain regions 66. As noted for the CMP process of FIG. 11 above, the CMP process of FIG. 14 may be continued until the upper surfaces of gate conductor 60 and source/drain regions 66 are at a slightly lower elevation than the elevation of the upper surface of gate conductor 60 before the CMP process of FIG. 14. In this way, the widths of the upper surfaces of spacers 50 are slightly increased, insuring adequate isolation between gate conductor 60 and source/drain regions 66. Turning now to FIG. 15, isolation trenches 68 may be formed on either side of the transistor which includes gate conductor 60 and source/drain regions 66. Isolation trenches 68 may be formed in a similar manner to source/drain trenches 36 shown in FIG. 3. Trenches 68 are subsequently filled with dielectric to form isolation regions 70, shown in FIG. 16. Trenches 68 may be filled using deposition and polishing techniques, as shown, for example, in FIGS. 4 and 5. Isolation regions 70, combined with isolating dielectric 22, serve to isolate the transistor of FIG. 16 from adjacent transistors. Isolation regions such as regions 70 may alternatively be formed at various times prior to formation of source/drain regions 66. Formation of isolation regions after formation of the source/drain regions may be advantageous, however, by avoiding bridging of previously formed isolation regions by residual conducting material from gate and/or source/drain formation.

Figure 16:
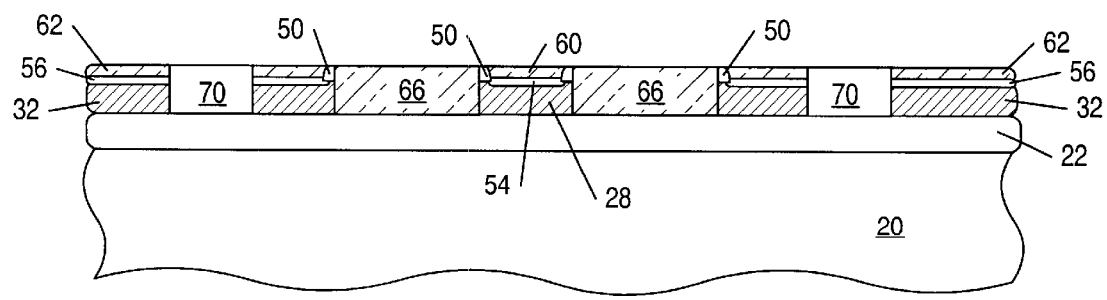
FIG. 16 is a partial cross-sectional view of the semiconductor topography, wherein the isolation trenches are filled with a dielectric, subsequent to the isolation trench formation of FIG. 15.

The transistor of FIG. 16 includes low-resistance metal source/drain and gate regions and is formed by a self-aligned process. The transistor channel is in polysilicon channel region 28, just below gate dielectric 54. The only masks required for the transistor formation are one for the source/drain trench formation of FIG. 3, and one for the isolation trench formation of FIG. 15. The method therefore requires minimal tolerances for mask alignment error, and small transistor feature sizes may be achieved. The use of a low-resistance metal source, drain and gate may greatly reduce contact and series resistances in the transistor, so that low RC time constants and high-speed operation may be obtained. Excessive parasitic capacitance between gate conductor 60 and source/drain regions 66 may be minimized by, for example, using spacers having a lateral width greater than about 150 angstroms and by forming spacers such as spacers 50 from a low-K dielectric. Transistors fabricated using the process recited herein may be particularly suitable for low-voltage applications using voltages less than or equal to about 1.5 volts. Further dielectric deposition, metal deposition, and patterning may subsequently be performed in order to form contacts and interconnects linking the transistor with other parts of an integrated circuit.

Figure 17:
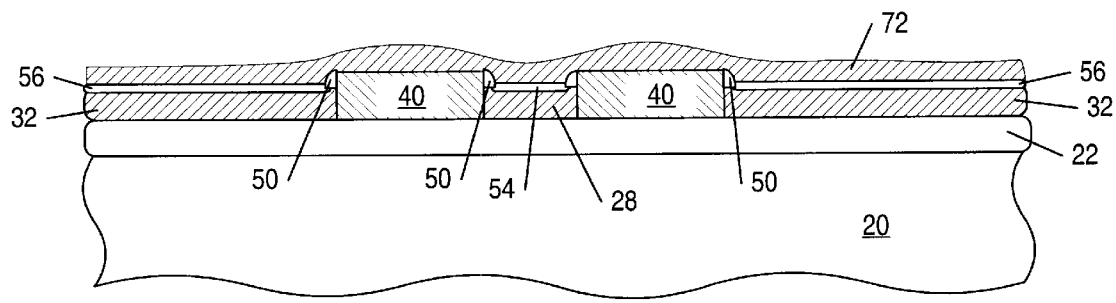
FIG. 17 is a partial cross-sectional view of the semiconductor topography according to an alternative embodiment, wherein a polysilicon layer is deposited over the gate dielectric, spacers and sacrificial dielectrics, subsequent to the gate dielectric formation of FIG. 9.
Figure 18:
FIG. 18 is a partial cross-sectional view of the semiconductor topography, wherein portions of the polysilicon layer extending above the upper surface of the sacrificial dielectrics are removed and dopant impurities are introduced, subsequent to the polysilicon deposition of FIG. 17.
Figure 18:
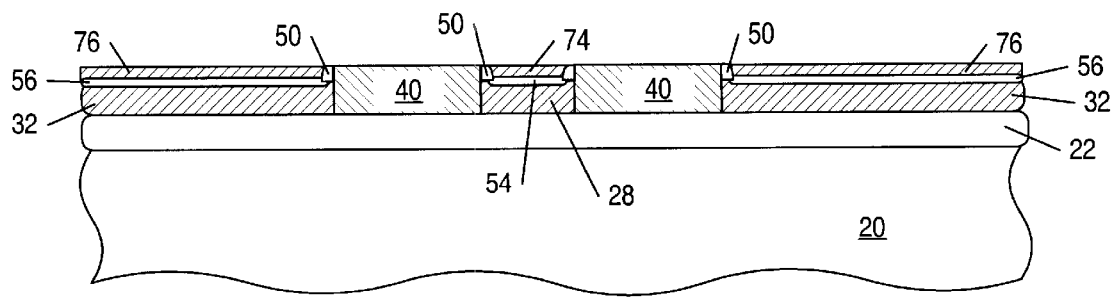
Figure 19:
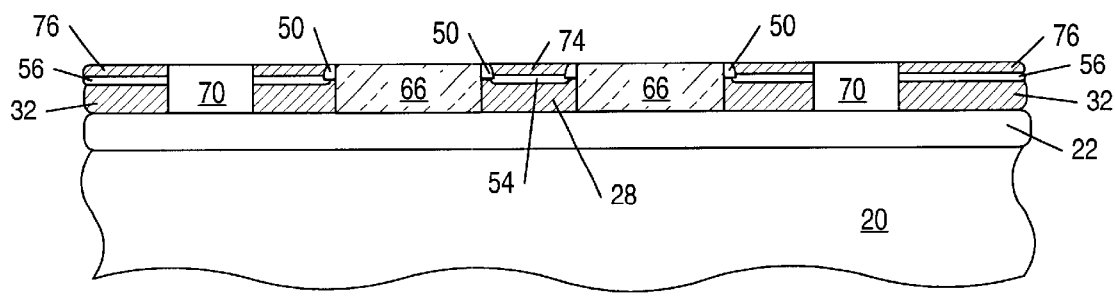
FIG. 19 is a partial cross-sectional view of the semiconductor topography, wherein metal source/drain regions and dielectric isolation regions are formed, subsequent to the impurity introduction of FIG. 18.

An alternate embodiment of the method recited herein is illustrated in FIGS. 17–19. Polysilicon layer 72 may be deposited over dielectrics 54 and 56, spacers 50, and sacrificial dielectrics 40, as shown in FIG. 17. Polysilicon layer 72 of this embodiment is used instead of conductive layer 58 of FIG. 10, which is preferably formed from metal. Use of a polysilicon gate may be advantageous for reasons which may include avoiding a work function difference between the gate conductor and channel of a transistor, or compatibility with conventional device fabrication. Polysilicon layer 72 is deposited in a manner similar to that of polysilicon layer 24 of FIG. 2. As in the case of layer 24, polysilicon layer 72 may be deposited in amorphous form and subsequently annealed so that polycrystalline silicon is formed. Portions of polysilicon layer 72 extending above the upper surfaces of sacrificial dielectrics 40 are subsequently removed, so that polysilicon gate conductor 74 is formed, as shown in FIG. 18. Gate conductor 74 may be doped using impurity introduction 78 to lower its resistivity. Impurity introduction 78 is preferably an ion implantation process, and the implantation energy and dose are adjusted so that gate conductor 74 is doped as heavily and uniformly as possible, while avoiding diffusion of dopants across gate dielectric 54 into the transistor channel. In embodiments for which gate conductor 74 is doped by ion implantation, a subsequent anneal is performed to activate implanted dopant impurities and repair damage to polysilicon gate conductor 74. Alternatively, gate conductor 74 may be doped during deposition of polysilicon layer 72. Continued processing of the semiconductor topography of FIG. 18 in the manner of FIGS. 12–16 results in the polysilicon-gate transistor of FIG. 19. The transistor of FIG. 19 is similar to that of FIG. 16 except that the gate is formed from polysilicon rather from metal.

It will be appreciated to those skilled in the art having the benefit of this disclosure that this invention is believed to provide a method for forming a self-aligned transistor having low-resistance metal source/drain regions by using sacrificial dielectric source/drain structures. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A transistor, comprising:
   an isolating dielectric arranged upon and in contact with a semiconductor substrate;
   a pair of source/drain regions arranged upon and in contact with the isolating dielectric, wherein the source/drain regions comprise a metal, and wherein an interface between the source/drain regions and the isolating dielectric comprises a metal;
   a silicon channel layer arranged upon the isolating dielectric, laterally adjacent and between the source/drain regions;
   a gate conductor dielectrically spaced above the silicon channel layer; and
   dielectric spacers arranged upon the silicon channel layer, contiguously interposed between opposing lateral surfaces of each of the source/drain regions and the gate conductor.

2. The transistor as recited in claim 1, wherein an upper surface of the gate conductor is at substantially the same elevation level as upper surfaces of the source/drain regions.

3. The transistor as recited in claim 1, wherein said metal comprises copper.

4. The transistor as recited in claim 1, wherein said gate conductor comprises a metal.

5. The transistor as recited in claim 4, wherein said metal comprises copper.

6. The transistor as recited in claim 5, wherein said gate conductor is spaced above silicon nitride.

7. The transistor as recited in claim 5, wherein said gate conductor comprises a titanium nitride layer adjacent to said copper.

8. The transistor as recited in claim 1, further comprising a pair of dielectric isolation regions arranged upon the isolating dielectric, wherein upper surfaces of the isolation regions are at substantially the same elevation level as an upper surface of the gate conductor, and wherein both of said source/drain regions are laterally disposed between the dielectric isolation regions.

9. The transistor as recited in claim 1, wherein said silicon channel layer comprises polysilicon.

10. The transistor as recited in claim 1, wherein said silicon channel layer comprises substantially monocrystalline silicon.

11. The transistor as recited in claim 1, further comprising a pad layer interposed between said isolating dielectric and said semiconductor substrate.

12. The transistor as recited in claim 1, wherein said silicon channel layer has a thickness less than 1500 angstroms.

13. The transistor as recited in claim 1, wherein said silicon channel layer comprises dopant impurities.

14. The transistor as recited in claim 1, wherein said gate conductor comprises polysilicon.

15. The transistor as recited in claim 14, wherein said polysilicon comprises dopant impurities.

16. The transistor as recited in claim 1, wherein upper surfaces of said dielectric spacers are substantially planar.

17. The transistor as recited in claim 1, wherein a lateral width of said dielectric spacers is between about 150 angstroms and about 300 angstroms.

18. The transistor as recited in claim 1, wherein said dielectric spacers comprise a low permittivity dielectric.

* * * * *